(12) United States Patent
Oikawa et al.

(10) Patent No.: US 10,715,128 B2
(45) Date of Patent: Jul. 14, 2020

(54) POWER SUPPLY VOLTAGE DETECTION CIRCUIT, SEMICONDUCTOR APPARATUS AND ELECTRONIC DEVICE

(71) Applicant: SEIKO EPSON CORPORATION, Tokyo (JP)

(72) Inventors: Nobuyuki Oikawa, Chino (JP); Toshikazu Kuwano, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/285,709

(22) Filed: Feb. 26, 2019

(65) Prior Publication Data

US 2019/0267980 A1    Aug. 29, 2019

(30) Foreign Application Priority Data

Feb. 27, 2018   (JP) ................................. 2018-032901

(51) Int. Cl.
*H03K 5/24* (2006.01)
*G05F 3/26* (2006.01)
*G01R 19/165* (2006.01)

(52) U.S. Cl.
CPC ..... *H03K 5/2481* (2013.01); *G01R 19/16519* (2013.01); *G05F 3/262* (2013.01)

(58) Field of Classification Search
CPC ............................................ H03F 2203/45612
See application file for complete search history.

(56) References Cited

U.S. PATENT DOCUMENTS

| | | | | |
|---|---|---|---|---|
| 4,593,208 A | * | 6/1986 | Single | G05F 3/30 323/316 |
| 4,792,749 A | | 12/1988 | Kitagawa et al. | |
| 8,253,453 B2 | * | 8/2012 | Vilas Boas | H03K 17/223 327/143 |
| 10,461,738 B1 | * | 10/2019 | Price | G06F 1/24 |
| 2004/0183587 A1 | * | 9/2004 | Yamahira | G05F 3/262 327/540 |

(Continued)

FOREIGN PATENT DOCUMENTS

| | | |
|---|---|---|
| JP | S63-085369 A | 4/1988 |
| JP | H10-117138 A | 5/1998 |

(Continued)

*Primary Examiner* — Adam D Houston
(74) *Attorney, Agent, or Firm* — Oliff PLC

(57) ABSTRACT

Provided is a power supply voltage detection circuit that prevents offsetting from occurring due to different voltages being applied for an extended period of time to gates of two transistors that constitute a differential pair in a comparator circuit that compares a comparison voltage that is generated based on a power supply voltage to a reference voltage. This power supply voltage detection circuit has a reference voltage generation circuit, a comparison voltage generation circuit, and a comparator circuit that includes a first transistor and a second transistor that constitute a differential pair and each have a gate to which a same bias voltage is applied, and a third transistor and a fourth transistor that are respectively connected in series to the first and second transistors and have sources to which the reference voltage and the comparison voltage are respectively applied.

21 Claims, 6 Drawing Sheets

(56) References Cited

U.S. PATENT DOCUMENTS

| | | | |
|---|---|---|---|
| 2007/0229157 A1* | 10/2007 | Bhattacharya | H03F 3/45183 |
| | | | 330/253 |
| 2016/0161532 A1* | 6/2016 | Sugiura | H03K 5/24 |
| | | | 327/109 |
| 2016/0342171 A1* | 11/2016 | Tomioka | H02M 3/156 |
| 2016/0378128 A1 | 12/2016 | Murayama et al. | |
| 2017/0288538 A1* | 10/2017 | Yamada | H02M 3/156 |
| 2019/0267980 A1* | 8/2019 | Oikawa | G01R 19/16519 |
| 2019/0310677 A1* | 10/2019 | Terasaki | G01R 19/16519 |

FOREIGN PATENT DOCUMENTS

| | | |
|---|---|---|
| JP | 2016-109616 A | 6/2016 |
| JP | 2017-009448 A | 1/2017 |
| JP | 2017-053748 A | 3/2017 |

\* cited by examiner

POWER SUPPLY VOLTAGE DETECTION CIRCUIT, SEMICONDUCTOR APPARATUS AND ELECTRONIC DEVICE

This application claims the benefit of priority from Japanese Patent Application No. 2018-032901 filed Feb. 27, 2018, the entire contents of the prior application being incorporated herein by reference.

BACKGROUND

1. Technical Field

The present disclosure relates to a power supply voltage detection circuit that detects whether a power supply voltage is higher or lower than a predetermined voltage. Furthermore, the disclosure relates to a semiconductor apparatus that is built into such a power supply voltage detection circuit, and an electronic device that uses such a power supply voltage detection circuit.

2. Related Art

For example, in microcontroller units (MCU) that are incorporated into electronic devices to realize specific functions, it is necessary to change the operational speed according to the level of a power supply voltage, or to turn a peripheral circuit ON or OFF. For this reason, a power supply voltage detection circuit that detects whether the power supply voltage is higher or lower than a predetermined voltage is used. Furthermore, the need for reduced consumption current and reduced circuit size in power supply voltage detection circuits has increased in recent years.

As a related technique, JP-A-10-117138 discloses a semiconductor integrated circuit that exhibits expected functionality irrespective of the power supply voltage, and can be manufactured at a low cost. This semiconductor integrated circuit includes a voltage divider circuit that has a plurality of circuits with different drive timings and that divides and outputs a power supply voltage, a reference voltage generation circuit that outputs a reference voltage, a comparator circuit that compares the output voltage of the voltage divider circuit to the reference voltage and outputs the comparison result as a control signal, and a timing compensation circuit that consists of multiple stages of delay circuits and that switches the number of stages of delay circuits depending on the control signal and compensates the drive timing of the plurality of circuits.

JP-A-10-117138 (paragraphs 0005 to 0006; FIG. 1) is an example of related art.

The semiconductor integrated circuit shown in FIG. 1 of JP-A-10-117138 uses a comparator circuit 1 that has a differential pair constituted by an N-channel MOSFET 15 that has a gate to which an output voltage from a voltage divider circuit 2 is applied, and an N-channel MOSFET 16 that has a gate to which the reference voltage is applied. However, if different voltages are continuously applied to the gates of the two transistors that constitute the differential pair for an extended period of time, the characteristics variation of these transistors differs, and offsetting may occur in the differential pair.

Also, ordinarily, current continues to flow to the plurality of transistors or resistors that are connected in series in a voltage divider circuit as long as the power supply voltage is being supplied to the semiconductor integrated circuit. Accordingly, in order to reduce the consumption current in the voltage divider circuit, it is necessary to increase the channel length of the transistors or the resistance value of the resistors, and it is difficult to reduce the size of the power supply voltage detection circuit.

SUMMARY

An advantage of some aspects of the embodiments is to provide a power supply voltage detection circuit that prevents offsetting from occurring due to different voltages being applied for an extended period of time to the gates of two transistors that constitute a differential pair in a comparator circuit that compares a comparison voltage that is based on a power supply voltage to a reference voltage, and improves the accuracy in detecting the power supply voltage.

Also, a second advantage of some aspects of the embodiments is to configure a power supply voltage detection circuit that does not use a voltage divider circuit that consumes current, and to realize both a reduction in the current consumption and a reduction in the size of the power supply voltage detection circuit.

In order to solve at least some of the problems described above, a power supply voltage detection circuit according to a first aspect of at least one embodiment has a reference voltage generation circuit that generates a reference voltage, a comparison voltage generation circuit that generates a comparison voltage based on a power supply voltage, and a comparator circuit that generates an output signal that indicates the result of the comparison between the comparison voltage and the reference voltage, and that includes a first transistor and a second transistor that constitute a differential pair and each have a gate to which the same bias voltage is applied, and a third transistor and a fourth transistor that are respectively connected in series to the first and second transistors and have sources to which the reference voltage and the comparison voltage are respectively applied.

According to the first aspect, it is possible to provide a power supply voltage detection circuit that prevents the occurrence of offsetting in the differential pair and improves the accuracy of detecting a power supply voltage, because the same bias voltage is applied to the gates of the first transistor and the second transistor that constitute the differential pair in the comparator circuit that generates an output signal that shows the result of comparing the reference voltage to the comparison voltage that is based on the power supply voltage.

Here, a configuration is possible in which the comparison voltage generation circuit includes a first clamp circuit that has a first clamp voltage and is connected between a power supply node to which a power supply voltage is supplied and a source of the fourth transistor, and includes a switch circuit and a clamp circuit that are connected in parallel to the first clamp circuit and are connected in series between the power supply node and the fourth transistor, and the second clamp circuit has a second clamp voltage that is different to the first clamp voltage, and the switch circuit is controlled by the output signal of the comparator circuit or an inverted signal thereof.

Thus, because the clamp voltage of the first or second clamp circuit is used to generate the comparison voltage, it is possible to constitute a power supply voltage detection circuit without using a voltage divider circuit that consumes current, and to realize both a reduction in the current consumption and a reduction in the size of the power supply voltage detection circuit. Furthermore, because the clamp voltage is switched by the switch circuit, it is possible to provide the power supply voltage detection circuit with hysteresis characteristics.

Also, the number of clamp elements that are included in the first clamp circuit may be greater than the number of clamp elements that are included in the second clamp circuit. Thus, even if clamp elements that have the same clamp voltage are used, the detection voltage of the power supply voltage detection circuit can be adjusted and the power supply voltage detection circuit can be provided with hysteresis characteristics.

Furthermore, a configuration is possible in which the reference voltage generation circuit includes a fifth transistor and a sixth transistor that have mutually different threshold voltages and constitute a second differential pair, and a seventh transistor and an eighth transistor that are respectively connected in series to the fifth and sixth transistors and constitute a current mirror circuit, and a voltage of a connection point of a drain and a gate of the sixth transistor is the reference voltage that is based on a voltage applied to a gate of the fifth transistor. Thus it is possible to generate a reference voltage with a high level of accuracy while both lowering the consumption current and reducing the size of the reference voltage generation circuit.

In this case, it is desirable that a ratio of the magnitude of a drain current of the seventh transistor and a magnitude of a drain current of a eighth transistor is 1:2, and a ratio of a magnitude of a drain current of the third transistor and a magnitude of a drain current of the fourth transistor is 1:1. Thus, it is possible to reliably change the output signal of the comparator circuit to high level or low level according to the level relationship between the comparison voltage and the reference voltage.

Also, a configuration is possible in which the comparator circuit further includes a ninth transistor that has a gate connected to a drain of the second transistor and a drain of the fourth transistor, and a tenth transistor that supplies a constant current to a drain of the ninth transistor. If an inverter is used at the output stage of the comparator circuit, in order to reduce the consumption current, it is necessary to increase the channel length of the transistors that constitute the inverter, but if an output transistor that operates by being supplied a constant current is used, it is possible to use a regular sized transistor and reduce the consumption current.

A semiconductor apparatus according to a second aspect of at least one embodiment and an electronic device according to a third aspect of at least one embodiment have any of the power supply voltage detection circuits described above. According to the second and third aspects, it is possible to provide a semiconductor apparatus or an electronic device that, by using a power supply voltage detection circuit that prevents the occurrence of offsetting in a differential pair and improves the detection accuracy of a power supply voltage, is capable of performing operations such as changing the operational speed according to a level of the power supply voltage or turning a peripheral circuit ON and OFF.

DESCRIPTION OF EXEMPLARY EMBODIMENTS

Figure 1:
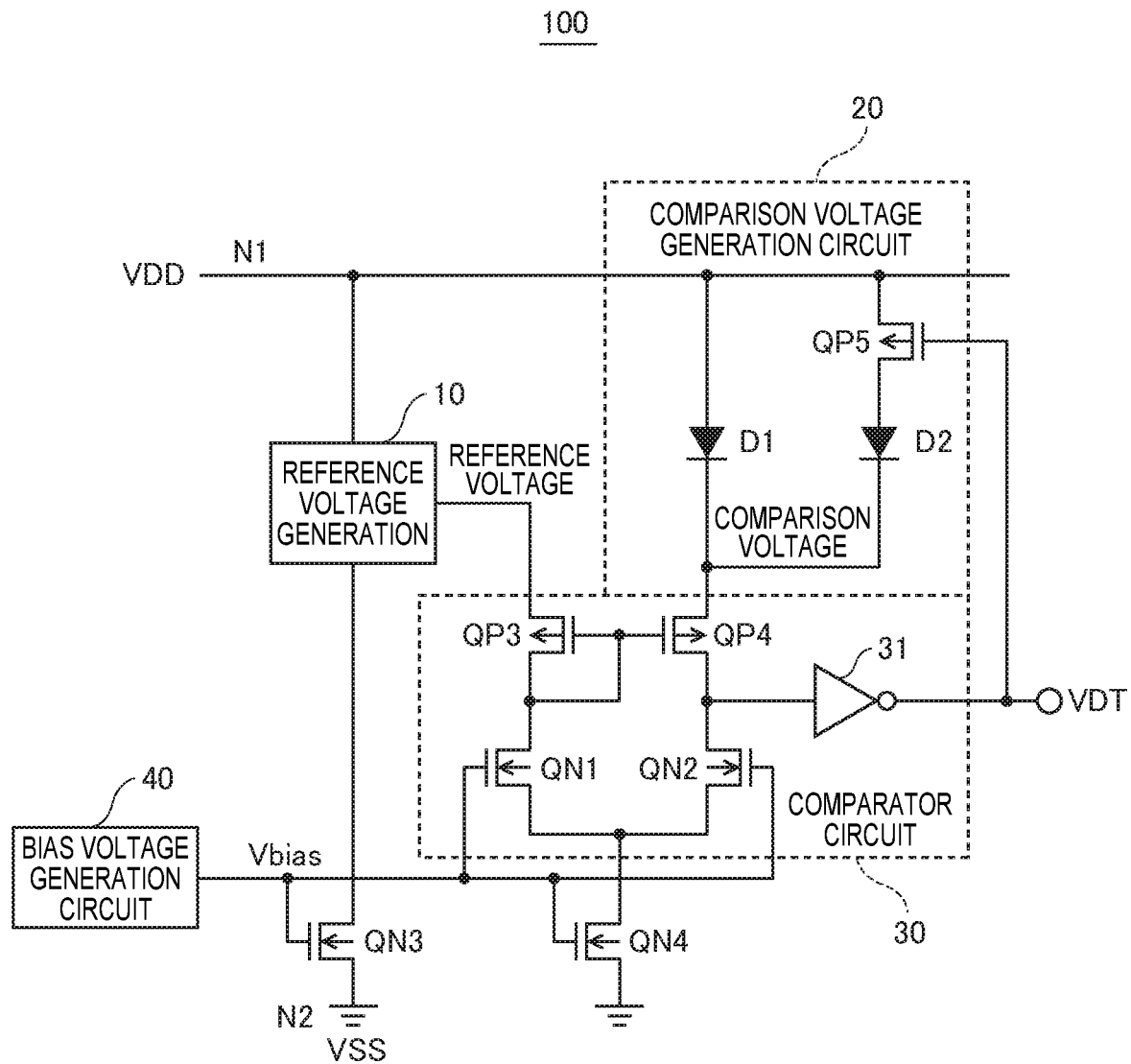
FIG. 1 shows a circuit diagram showing an exemplary configuration of a power supply voltage detection circuit according to a first embodiment of the invention.

The following is a detailed description of embodiments of the invention with reference to the drawings. Note that the same constituent elements are denoted with the same reference numerals and redundant descriptions are omitted.

First Embodiment

FIG. 1 is a circuit diagram showing an exemplary configuration of a power supply voltage detection circuit according to a first embodiment of the invention. A power supply voltage detection circuit 100, for example, may be used in an electronic device that operates by being supplied a power supply voltage from a battery, and may be built into a semiconductor apparatus.

As shown in FIG. 1, the power supply voltage detection circuit 100 includes a reference voltage generation circuit 10, a comparison voltage generation circuit 20, a comparator circuit 30, a bias voltage generation circuit 40, and N-channel MOS (metal oxide semiconductor) transistors QN3 and QN4 as constant current sources. A power supply potential VDD on the high potential side and power supply potential VSS on the low potential side are supplied to the power supply voltage detection circuit 100. In the following description, the power supply potential VSS is a ground potential (0V), and the power supply voltage VDD is supplied to a power supply node N1.

The transistor QN3 has a drain that is connected to the reference voltage generation circuit 10, a gate to which a bias voltage Vbias is applied from the bias voltage generation circuit 40, and a source that is connected to a ground node N2 to which a ground potential (0V) is applied, and supplies a constant current to the reference voltage generation circuit 10. The transistor QN4 has a drain that is connected to the comparator circuit 30, a gate to which the bias voltage Vbias is applied from the bias voltage generation circuit 40 and a source that is connected to the ground node N2, and supplies a constant current to the comparator circuit 30.

The reference voltage generation circuit 10 generates a reference voltage, as a result of operating by being supplied a constant current from the transistor QN3. Also, the comparison voltage generation circuit 20 generates a comparison voltage based on the power supply voltage VDD. The comparator circuit 30 generates an output signal VDT that shows the result of comparing the comparison voltage to the reference voltage, due to operating by being supplied a constant current from the transistor QN4.

The comparator circuit 30 has N-channel MOS transistors QN1 and QN2 that have gates to which the same bias voltage Vbias is applied as a first transistor and a second transistor that constitute a differential pair, includes a P-channel MOS transistor QP3 as a third transistor that is connected in series to the first transistor and has a source to which the reference voltage is applied, and a P-channel MOS transistor QP4 as a fourth transistor that is connected in series to the second transistor and has a source to which the comparison voltage is applied, and further includes an inverter 31.

The transistors QN1 and QN2 each have a gate to which the bias voltage Vbias is applied from the bias voltage generation circuit 40, and have a source that is connected to a drain of the transistor QN4. The transistor QP3 has a source to which the reference voltage is applied from the reference voltage generation circuit 10, and has a gate and a drain that are connected to a drain of the transistor QN1. The transistor QP4 has a source to which the comparison voltage is applied from the comparison voltage generation circuit 20, a gate that is connected to the gate and the drain of the transistor QP3, and a drain that is connected to the drain of the transistor QN2.

Here, the transistors QN1, QN2, QN3, and QN4 constitute a differential amplifier circuit. Because the voltage of each component of the differential amplifier circuit tends to reach its operational lower limit if the reference voltage is low at about 1 V, it is possible to enlarge the operation voltage range of the differential amplifier circuit by using transistors that have a low threshold voltage as the transistors QN1, QN2, QN3, and QN4.

The inverter 31 inputs a voltage in the connection point between the drain of the transistor QN2 and the drain of the transistor QP4, and inverts the input voltage to generate the output signal VDT. In this case, the comparator circuit 30 deactivates the output signal VDT to high level when the comparison voltage is lower than the reference voltage, and activates the output signal VDT to low level when the comparison voltage is higher than the reference voltage.

The comparison voltage generation circuit 20 includes a first clamp circuit that is connected between the power supply node N1 to which the power supply voltage VDD is supplied and the source of the transistor QP4, and a switch circuit and a second clamp circuit that are connected in parallel to the first clamp circuit and are connected in series between the power supply node N1 and the source of the transistor QP4.

In the example shown in FIG. 1, the first clamp circuit includes a diode D1 as a clamp element and has a first clamp voltage (0.7 V in the present embodiment). The second clamp circuit includes a diode D2 as a clamp element and has a second clamp voltage (0.4 V in the present embodiment) that is different to the first clamp voltage (lower than the first clamp voltage in the present embodiment).

Also, the switch circuit is constituted by a P-channel MOS transistor QP5. The transistor QP5 has a source that is connected to the power supply node N1, a gate to which the output signal VDT of the comparator circuit 30 and the inverted signal thereof are applied, and a drain that is connected to the diode D2, and is controlled by the output signal VDT of the comparator circuit 30 or the inverted signal thereof. In the example shown in FIG. 1, the transistor QP5 is controlled by the output signal VDT of the comparator circuit 30.

Accordingly, when the power supply voltage VDD is lower than a predetermined voltage, the output signal VDT of the comparator circuit 30 is deactivated to high level and the transistor QP5 enters a non-conductive state. On the other hand, when the power supply voltage VDD is higher than the predetermined voltage, the output signal VDT of the comparator circuit 30 is activated to low level and the transistor QP3 enters a conductive state. The transistor QP5, in the conductive state, need only have a current supply capacity that allows the diode D2 to operate under saturation conditions, and thus does not need to have a large size.

Alternatively, a configuration is possible in which another inverter is added to the later stage of the inverter, the output signal VDT is deactivated to low level when the power supply voltage VDD is lower than a predetermined voltage, and the output signal VDT is activated to high level when the power supply voltage VDD is higher than the predetermined voltage. In such a case, the transistor QP5 is controlled by the inverted signal of the output signal VDT of the comparator circuit 30.

The diode D1 has an anode that is connected to the power supply node N1 and a cathode that is connected to the source of the transistor QP4, and clamps the voltage between the power supply node N1 and the transistor QP4 to the first clamp voltage when the transistor QP5 is in a non-conductive state.

The diode D2 has an anode that is connected to the drain of the transistor QP5 and a cathode that is connected to the source of the transistor QP4, and clamps the voltage between the power supply node N1 and the transistor QP4 to the second clamp voltage when the transistor QP5 is in a conductive state.

For example, if the reference voltage is 1.0 V, when the power supply voltage VDD is lower than a first predetermined voltage of 1.7 V, the comparison voltage will be lower than 1.0 V, and the power supply voltage detection circuit 100 deactivates the output signal VDT to high level. At this time, the transistor QP5 is in a non-conductive state, and the diode D1 sets the comparison voltage to (VDD-0.7 V).

On the other hand, when the power supply voltage VDD is higher than the first predetermined voltage of 1.7 V, the comparison voltage will be higher than 1.0 V and the power supply voltage detection circuit 100 activates the output signal VDT to low level. Through this, the transistor QP5 enters a conductive state and the diode D2 sets the comparison voltage to (VDD-0.4 V).

Accordingly, if the power supply voltage VDD is temporarily higher than the first predetermined voltage of 1.7 V, provided that the power supply voltage VDD does not become lower than a second predetermined voltage of 1.4 V, the power supply voltage detection circuit 100 maintains the output signal VDT at low level. Thus, by providing the power supply voltage detection circuit 100 with hysteresis characteristics, it is possible to make the power supply voltage detection circuit 100 less susceptible to the influence of noise and the like that is included in the power supply voltage VDD.

According to the present embodiment, it is possible to provide the power supply voltage detection circuit 100 that prevents offsetting from occurring in the differential pair and improves the accuracy of detecting the power supply voltage VDD, because the same bias voltage Vbias is applied to the two transistors QN1 and QN2 that constitute the differential pair in the comparator circuit 30 that generates the output signal showing the result of a comparison between the reference voltage and the comparison voltage that is based on the power supply voltage VDD.

Also, because the clamp voltage of the diode D1 or the diode D2 is used to generate the comparison voltage, it is possible to configure the power supply voltage detection circuit 100 without using a voltage divider circuit that consumes current, and to realize both a reduction in the power consumption and a reduction in the size of the power supply voltage detection circuit 100. Furthermore, because the clamp voltage is switched by the transistor QP5, it is possible to provide the power supply voltage detection circuit 100 with hysteresis characteristics.

Second Embodiment

Figure 2:
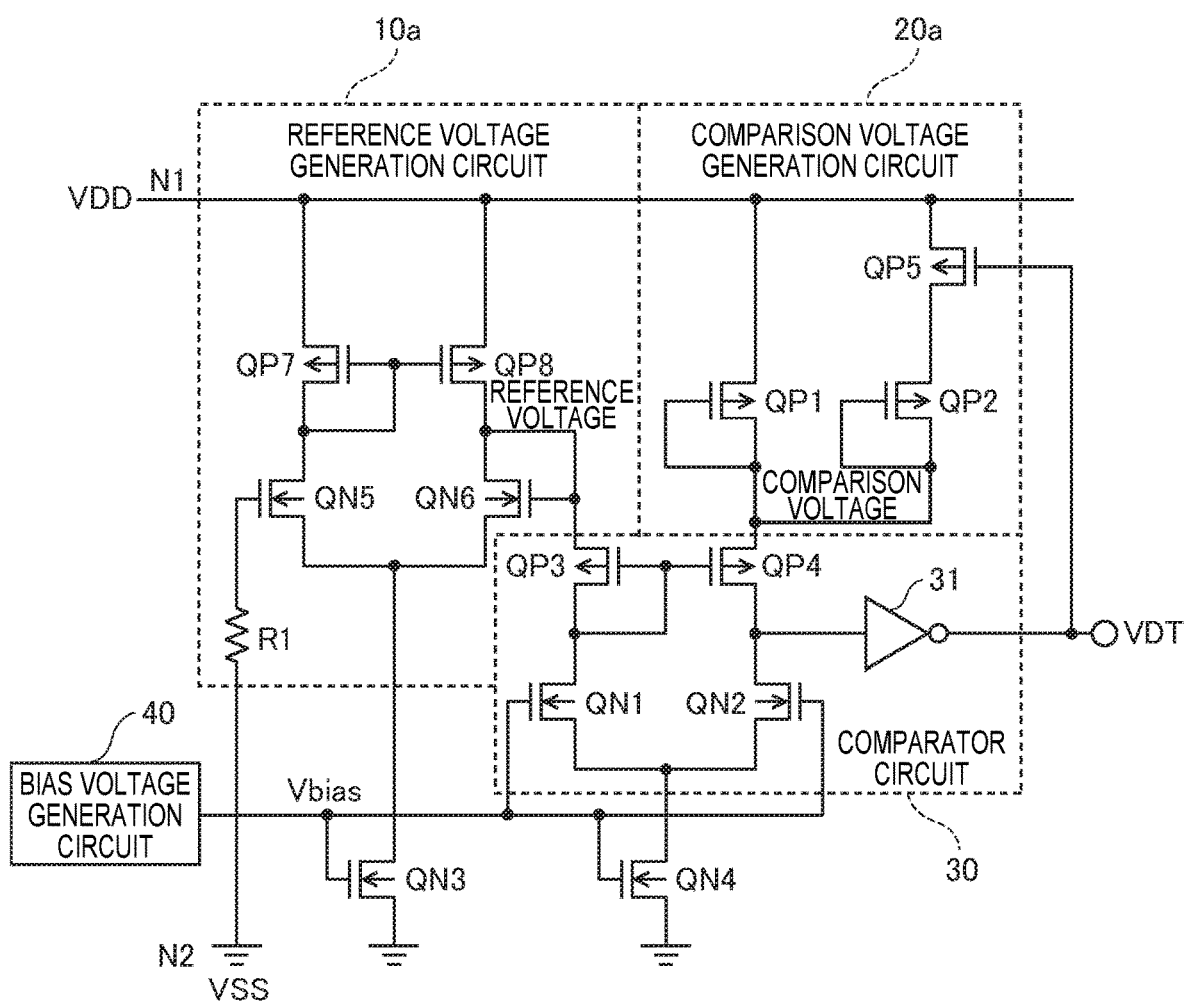
FIG. 2 is a circuit diagram showing an exemplary configuration of a power supply voltage detection circuit according to a second embodiment of the invention.

FIG. 2 is a circuit diagram showing an exemplary configuration of the power supply voltage detection circuit according to a second embodiment of the present embodiment. In the second embodiment, instead of the reference voltage generation circuit 10 and the comparison voltage generation circuit 20 of the first embodiment as shown in FIG. 1, a reference voltage generation circuit 10a and a comparison voltage generation circuit 20a are used. Other aspects of the second embodiment may be similar to those in the first embodiment.

As shown in FIG. 2, the reference voltage generation circuit 10a includes N-channel MOS transistors QN5 and QN6 as fifth and sixth transistors that constitute a second differential pair, P-channel transistors QP7 and QP8 as seventh and eighth transistors that constitute a current mirror circuit that are respectively connected in series to the fifth and sixth transistors, and a resistor R1.

The transistor QN5 has a gate that is connected to the ground node N2 via the resistor R1 and a source that is connected to the drain of the transistor QN3. The transistor QN6 has a gate and a drain connected to the source of the transistor QP3 and a source that is connected to the drain of the transistor QN3.

The transistor QP7 has a source that is connected to the power supply node N1 and a drain and a gate connected to the drain of the transistor QN5. The transistor QP8 has a source that is connected to the power supply node N1, a gate that is connected to the gate and drain of the transistor QP7, and a drain that is connected to the drain and gate of the transistor QN6.

In the example shown in FIG. 2, a depletion-type transistor is used as the transistor QN5, and an enhancement-type transistor is used as the transistor QN6. Accordingly, the transistors QN5 and QN6 have mutually different threshold voltages according to the difference in work functions of the transistors.

The reference voltage generation circuit 10a generates the reference voltage in the connection point between the drain and gate of the transistor QN6, based on the voltage (ground potential 0 V in the present embodiment) that is applied to the gate of the transistor QN5. That is to say, the voltage of the connection point between the drain and the gate of the transistor QN6 is the reference voltage that is based on the voltage that is applied to the gate of the transistor QN5. Thus, it is possible to generate a reference voltage with a high level of accuracy while both lowering the consumption current and reducing the size of the reference voltage generation circuit 10a. Also, by balancing the temperature characteristics of the depletion-type transistor QN5 and the enhancement-type transistor QN6, it is possible to substantially flatten the temperature characteristics of the reference voltage.

Figure 3:
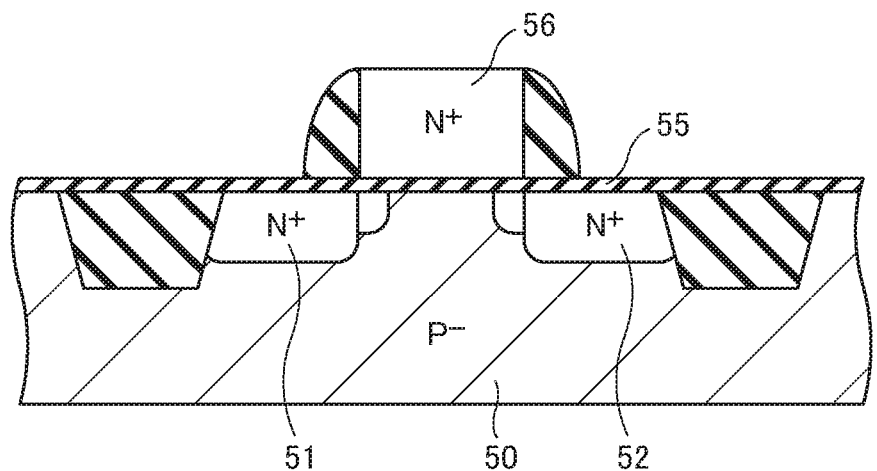
FIG. 3 is a cross-sectional view of an exemplary configuration of a transistor QN5 that is shown in FIG. 2.
Figure 4:
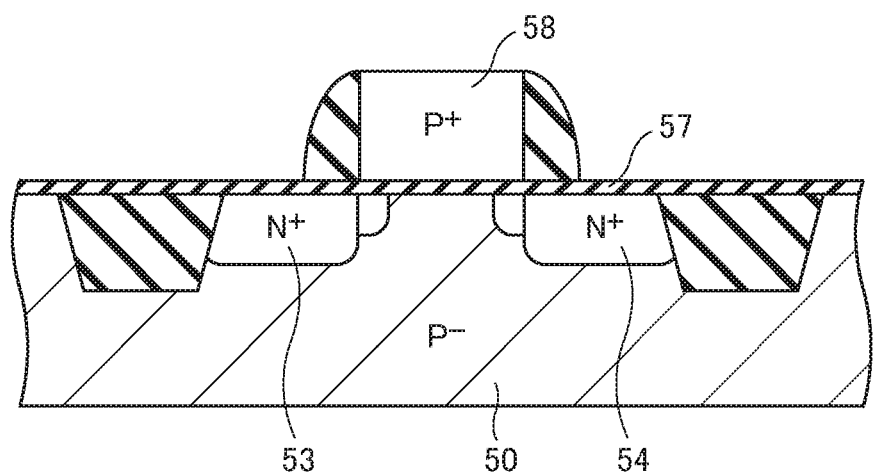
FIG. 4 is a cross-sectional view of an exemplary configuration of a transistor QN6 that is shown in FIG. 2.

FIG. 3 is a cross-sectional view showing an exemplary configuration of the transistor QN5 shown in FIG. 2, and FIG. 4 is a cross-sectional view showing an exemplary configuration of the transistor QN6 shown in FIG. 2. N-type impurity regions 51 to 54 that serve as the drain and source of the transistors QN5 and QN6 are arranged in a P-type semiconductor substrate (or a P-well) 50.

As shown in FIG. 3, a polysilicon film 56 that serves as a gate electrode of the transistor QN5 is arranged, via a gate insulating film 55, on the semiconductor substrate 50 sandwiched between the N-type impurity regions 51 and 52. The polysilicon film 56 is doped with an N-type impurity such as phosphorus (P) or arsenic (As).

On the other hand, as shown in FIG. 4, a polysilicon film 58 that serves as a gate electrode of the transistor QN6 is arranged, via a gate insulating film 57, on the semiconductor substrate 50 sandwiched between the N-type impurity regions 53 and 54. The polysilicon film 58 is doped with a P-type impurity such as boron (B). Through this, the transistors QN5 and QN6 have mutually different threshold voltages even if they have the same shape.

Referring again to FIG. 2, the transistor QP7 supplies current to the transistor QP5 only, while the transistor QP8 supplies current to both of the transistors QN6 and QP3. Accordingly, it is desirable that the ratio of the magnitude of the drain current of the transistor QP7 and the magnitude of the drain current of the transistor QP8 is 1:2. For this reason, for example, the channel lengths of the transistors QP7 and QP8 are set to be substantially equal, and the channel width of the transistor QP8 is set to be approximately twice as wide as the channel width of the transistor QP7. Note that the ratio of the magnitude of the drain current of the transistor QP7 and the magnitude of the drain current of the transistor QP8 being 1:2 means that an appropriate ratio range other than 1:2 may also be provided. This range need only be a range sufficient for achieving the advantage(s) discussed in the present disclosure.

Also, if the reference voltage and the comparison voltage are substantially equal, it is desirable that the transistors QP3 and QP4 supply a substantially equal current to the transistors QN1 and QN2. Accordingly, it is desirable that the ratio of the magnitude of the drain current of the transistor QP3 and the magnitude of the drain current of the transistor QP4 is 1:1. For this reason, for example, the channel lengths of the transistors QP3 and QP4 are set to be substantially equal, and the channel widths of the transistor QP3 and the channel width of the transistor QP4 are set to be substantially equal. According to the above, it is possible to reliably change the output signal VDT of the comparator circuit 30 to high level or low level according to the level relationship between the comparison voltage and the reference voltage. Note that the ratio of the magnitude of the drain current of the transistor QP3 and the magnitude of the drain current of the transistor QP4 being 1:1 means that an appropriate ratio range other than 1:1 may be provided. This range need only be a range sufficient for achieving the advantage(s) discussed in the present disclosure.

The comparison voltage generation circuit 20a includes P-channel MOS transistors QP1 and QP2, instead of the diodes D1 and D2 shown in FIG. 1. The transistor QP1 has a source that is connected to the power supply node N1 and a drain and a gate connected to the source of the transistor QP4. The transistor QP2 has a source that is connected to the drain of the transistor QP5 and a drain and a gate connected to the source of the transistor QP4.

Because the transistors QP1 and QP2 are connected to a gate and a drain, they are equivalent to diodes and are used as clamp elements. By changing factors such as the concentration of impurities to be doped in the channel regions of the transistors QP1 and QP2, the transistors QP1 and QP2 have mutually different threshold voltages (clamp voltages). For example, the threshold voltage of the transistor QP1 is 0.7 V, and the threshold voltage of the transistor QP2 is 0.4 V.

Third Embodiment

Figure 5:
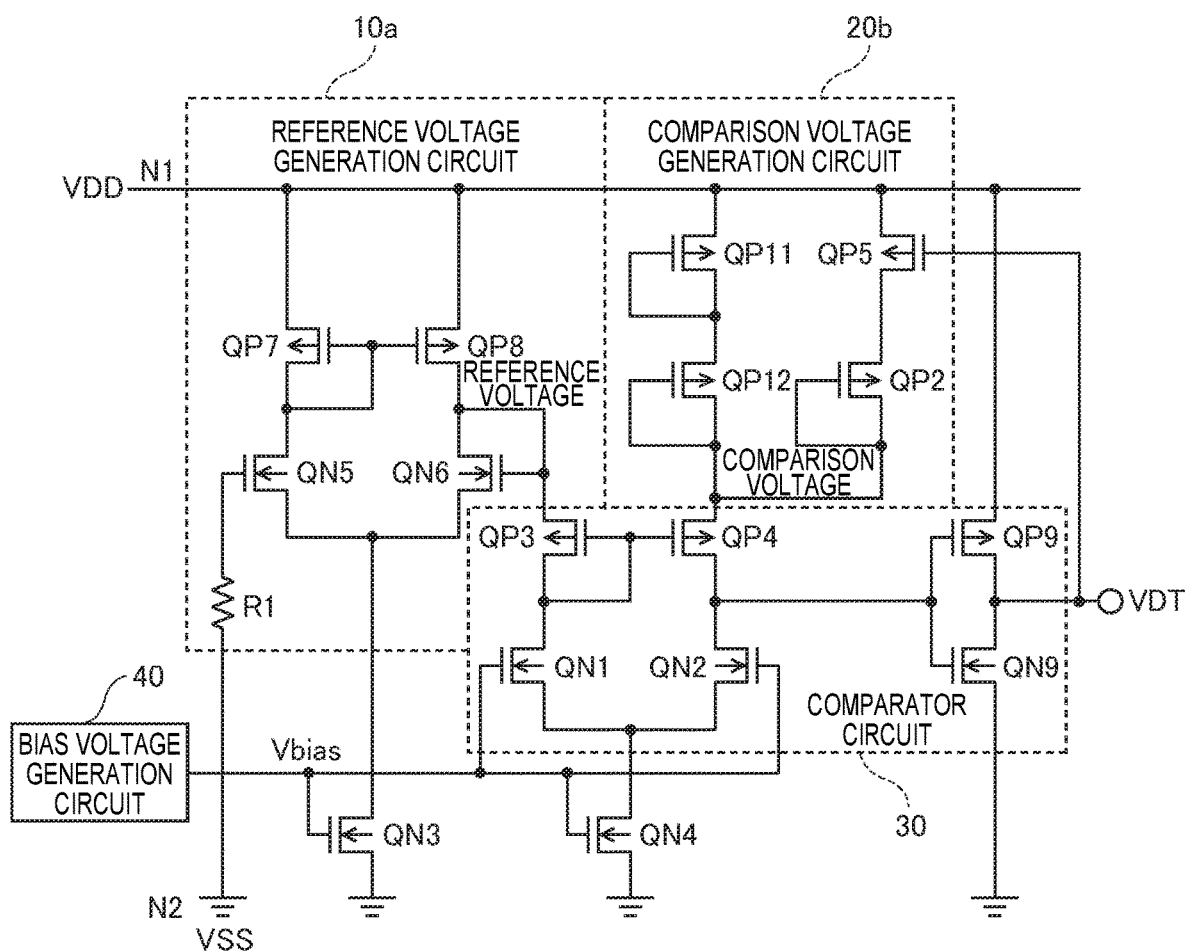
FIG. 5 is a circuit diagram showing an exemplary configuration of a power supply voltage detection circuit according to a third embodiment of the invention.

FIG. 5 is a circuit diagram showing an exemplary configuration of a power supply voltage detection circuit according to a third embodiment of the invention. In the third embodiment, a comparison voltage generation circuit 20b is used instead of the comparison voltage generation circuit 20a in the second embodiment shown in FIG. 2. Other aspects of the third embodiment may be similar to those in the second embodiment.

In the third embodiment, the number of clamp elements that are included in the first clamp circuit is greater than the number of clamp elements that are included in the second clamp circuit. Thus, even if using clamp elements that have the same clamp voltage, the detection voltage of the power supply voltage detection circuit 100 can be adjusted and the power supply voltage detection circuit 100 can be provided with hysteresis characteristics.

In the example shown in FIG. 5, as the clamp elements, the first clamp element includes two P-channel MOS transistors QP11 and QP12, and the second clamp element includes one P-channel MOS transistor QP2. The transistor QP11 has a source that is connected to the power supply node The transistor QP12 has a source that is connected to the gate and the drain of the transistor QP11, and a drain and a gate that are connected to the source of the transistor QP4.

Because the transistors QP11, QP12 and QP2 are connected to a gate and a drain, they are equivalent to diodes, and may also have the same threshold voltage (clamp voltage). In this case, the total value of the threshold voltages of the transistors QP11 and QP12 is twice (1.4 V) the threshold voltage of the transistor QP2 (0.7 V in the present embodiment).

For example, if the reference voltage is 1.0 V, when the power supply voltage VDD is lower than a first predetermined voltage of 2.4 V, the comparison voltage will be lower than 1.0 V, and the power supply voltage detection circuit 100 deactivates the output signal VDT to high level. At this time, the transistor QP5 is in a non-conductive state, and the transistors QP11 and QP12 set the comparison voltage to (VDD-1.4 V).

On the other hand, when the power supply voltage VDD is higher than the first predetermined voltage of 2.4 V, the comparison voltage will be higher than 1.0 V and the power supply voltage detection circuit 100 activates the output signal VDT to low level. Through this, the transistor QP5 is in a conductive state and the transistor QP2 sets the comparison voltage to (VDD-0.7 V).

Accordingly, if the power supply voltage VDD is temporarily higher than the first predetermined voltage of 2.4 V, provided that the power supply voltage VDD does not become lower than a second predetermined voltage of 1.7 V, the power supply voltage detection circuit 100 maintains the output signal VDT at low level. In this way, by providing the power supply voltage detection circuit 100 with hysteresis characteristics, the power supply voltage detection circuit 100 can be made less susceptible to the influence of noise and the like that is included in the power supply voltage VDD.

Also, FIG. 5 shows the P-channel MOS transistor QP9 and the N-channel MOS transistor QN9 that constitute the inverter 31 of the output stage in the comparator circuit 30 (see FIG. 2). Because there are cases in which the input voltage of the inverter 31 is maintained at a voltage that is close to the threshold value of the inverter 31, it is possible to reduce the consumption current and to slow down the response speed to make the power supply voltage detection circuit 100 less susceptible to the influence of noise, and the like, by increasing the channel length of the transistors QP9 and QN9 that constitute the inverter 31.

Fourth Embodiment

Figure 6:
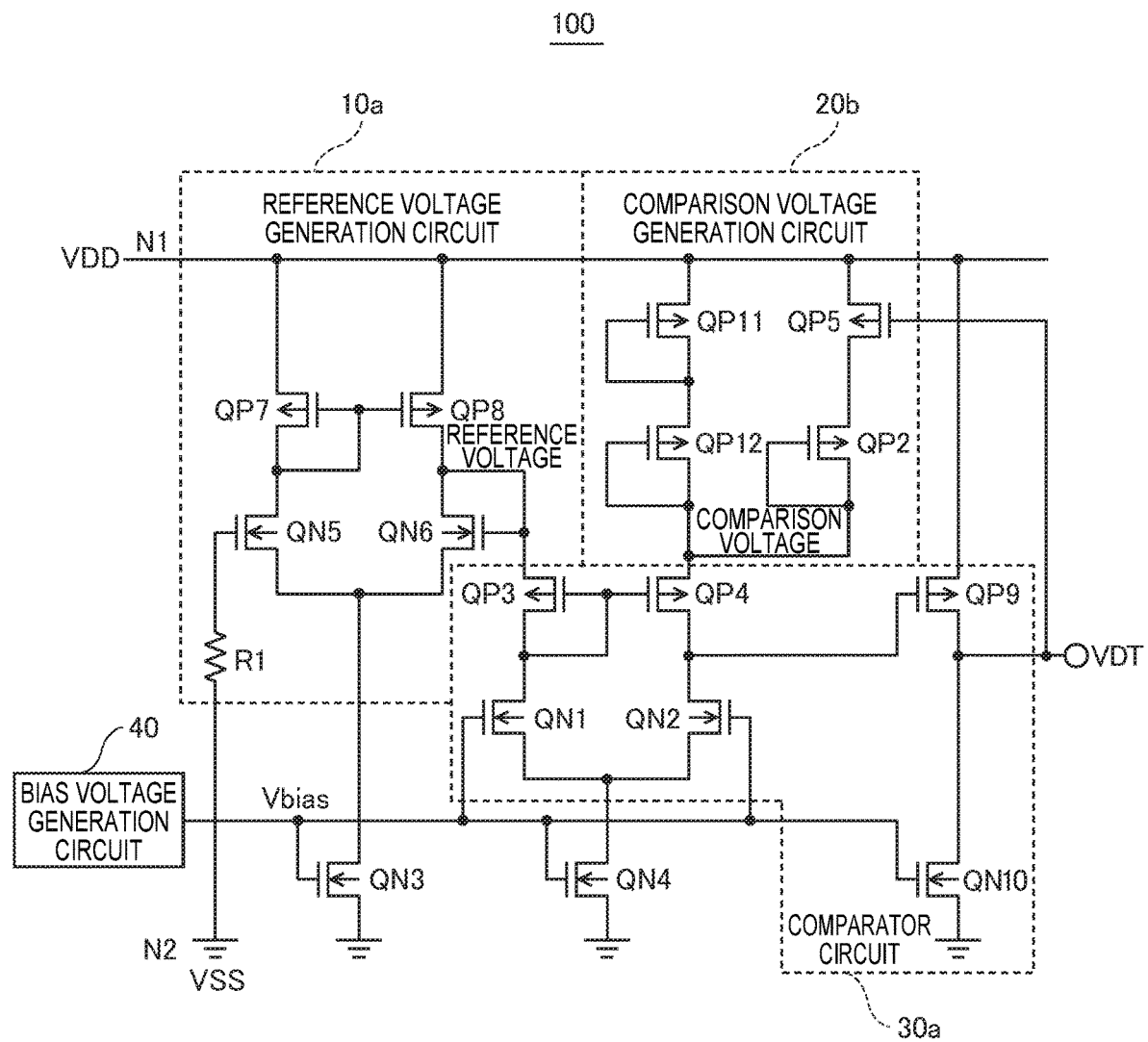
FIG. 6 is a circuit diagram showing an exemplary configuration of a power supply voltage detection circuit according to a fourth embodiment of the invention.

FIG. 6 is a circuit diagram showing an exemplary configuration of a power supply voltage detection circuit according to a fourth embodiment of the invention. In the fourth embodiment, a comparator circuit 30a is used instead of the comparator circuit 30 in the third embodiment shown in FIG. 5. Other aspects of the fourth embodiment may be similar to those in the third embodiment.

The comparator circuit 30a includes a P-channel MOS transistor QP9 (ninth transistor) that has a gate that is connected to the drain of the transistor QN2 and the drain of the transistor QP4, and an N-channel MOS transistor QN10 that supplies a constant current to the drain of the transistor QP9, instead of the inverter 31 of the output stage in the comparator circuit 30 shown in FIG. 2.

The transistor QP9 has a source that is connected to the power supply node N1 and a drain that is connected to the output terminal of the output signal VDT. The transistor QN10 has a drain that is connected to the drain of the transistor QP9, a gate to which the bias voltage Vbias is applied from the bias voltage generation circuit 40, and a source that is connected to the ground node N2. Accordingly, the constant current that the transistor QN10 supplies to the transistor QP9 is set by the bias voltage Vbias.

If the inverter 31 is used at the output stage of the comparator circuit 30 shown in FIG. 2 and the like, in order to reduce the consumption current, it is necessary to increase the channel length of the transistors that constitute the inverter 31, but if an output transistor that operates by being supplied a constant current is used, it is possible to reduce the consumption current using a regular sized transistor.

Electronic Device

Next, an electronic device according to any of the embodiments of the invention will be described, with reference to FIG. 7.

Figure 7:
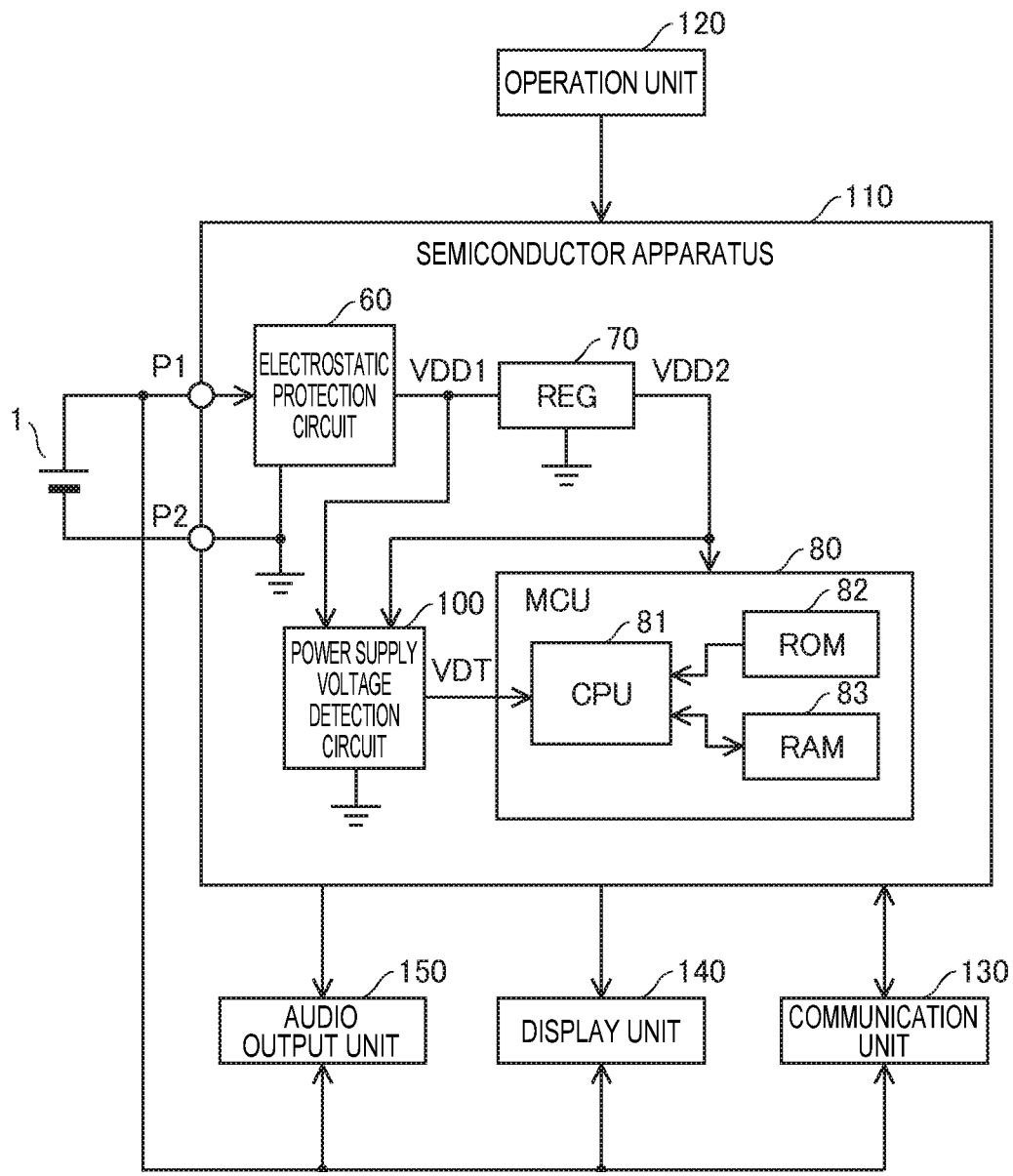
FIG. 7 is a block diagram showing an exemplary configuration of an electronic device according to an embodiment of the invention.

FIG. 7 is a block diagram showing an exemplary configuration of an electronic device according to one embodiment of the invention. This electronic device includes a semiconductor apparatus 110, an operation unit 120, a communication unit 130, a display unit 140, and an audio output unit 150. Here, the semiconductor apparatus 110 and constituent elements from the communication unit 130 to the audio output unit 150 may also operate by being supplied with a power supply voltage from a battery 1. Also, some of the constituent elements shown in FIG. 7 may also be omitted or changed, or other constituent elements may be added to the constituent elements shown in FIG. 7.

The semiconductor apparatus 110 according to an embodiment of the invention includes an electrostatic protection circuit 60, a regulator (REG) 70, a microcontroller unit (MCU) 80, and the power supply voltage detection circuit 100. Also, the MCU 30 includes a CPU (Central Processing Unit) 81, a ROM (Read-Only Memory) 82 and a RAM (Random Access Memory) 83.

The electrostatic protection circuit 60 reduces the voltage between the power supply terminal P1 and the power supply terminal P2 if static electricity is applied between a power supply terminal P1 and a power supply terminal P2 when the battery 1 is not connected to the power supply terminal P1 and P2. The regulator 70 outputs a stabilized power supply voltage VDD2 by stabilizing a power supply voltage VDD1 that is supplied from the battery 1 via the electrostatic protection circuit 60. The power supply voltage VDD2 that is output from the regulator 70 is supplied to each component of the semiconductor apparatus 110.

The CPU 81 performs various types of computational processing and control processing using data and the like that is stored in the ROM 82 and the like, in accordance with programs. For example, the CPU 81 performs various types of data processing according to operation signals output from the operation unit 120, controls the communication unit 130 in order to perform data communication with the outside, generates image signals for displaying various types of images on the display unit 140, and generates audio signals for outputting various types of audio from the audio output unit 150.

The ROM 82 stores programs, data and the like for the CPU 81 to perform various types of computational processing and control processing. Also, the RAM 83 is used as a work area of the CPU 81, and temporarily stores programs and data read out from the ROM 82, data input using the operation unit 120, or the results of computation executed by the CPU 81 in accordance with the programs.

The power supply voltage detection circuit 100 compares the power supply voltage VDD1 that is supplied from the battery 1 via the electrostatic protection circuit 60 or the power supply voltage VDD2 that is stabilized by the regulator 70 to a predetermined voltage, and outputs the output signal VDT indicating the result of the comparison to the CPU 81. Thus, the CPU 18 changes the operational speed according to the level of the power supply voltage VDD2 or turns a peripheral circuit ON or OFF.

The operation unit 120 is an input device including an operation key, a button switch, or the like, and outputs operation signals that depend on operations by a user to the CPU 81, for example. The communication unit 130 is constituted by analog circuits and digital circuits, for example, and performs data communication between the CPU 81 and external devices. The display unit 140 includes an LCD (Liquid Crystal Display) or the like, for example, and displays various types of information based on display signals that are supplied from the CPU 81. Also, the audio output unit 150 includes a speaker or the like, for example, and outputs audio based on audio signals that are supplied from the CPU 81.

According to the present embodiment, it is possible to provide a semiconductor apparatus 110 or an electronic device that, by using the power supply voltage detection circuit 100 that prevents the occurrence of offsetting in a differential pair and improves the detection accuracy of the power supply voltage, is capable of changing the operational speed according to the level of the power supply voltage VDD2 or turning a peripheral circuit ON and OFF.

Applicable electronic devices include, for example, a calculator, an electronic dictionary, an electronic game console, a mobile terminal such as a mobile phone, a digital still camera, a digital movie camera, a television, a videophone, a security television monitor, a head-mounted display, a personal computer, a printer, a network device, a car navigation device, a measurement device, and medical equipment (e.g., electronic thermometer, sphygmomanometer, glucometer, electrocardiographic apparatus, ultrasound diagnostic equipment, and electronic endoscope).

The invention is not limited to the foregoing embodiments, and numerous modifications can be made within the technical concept of the invention, by a person with ordinary skill in the art. For example, it is possible to combine and implement a plurality of embodiments selected from the foregoing embodiments.

What is claimed is:

1. A power supply voltage detection circuit comprising:
    a reference voltage generation circuit that generates a reference voltage;
    a comparison voltage generation circuit that generates a comparison voltage based on a power supply voltage; and
    a comparator circuit that generates an output signal that indicates a result of a comparison between the comparison voltage and the reference voltage, the comparator circuit including:
        a first transistor and a second transistor that constitute a differential pair and each have a gate to which a same bias voltage is applied;
        a third transistor that is connected in series to the first transistor and has a source to which the reference voltage is applied; and
        a fourth transistor that is connected in series to the second transistor and has a source to which the comparison voltage is applied.

2. The power supply voltage detection circuit according to claim 1, wherein:
    the comparison voltage generation circuit includes:
        a first clamp circuit that has a first clamp voltage and is connected between a power supply node to which the power supply voltage is supplied and a source of the fourth transistor; and
        a switch circuit and a second clamp circuit that are connected in parallel to the first clamp circuit and are connected in series between the power supply node and the source of the fourth transistor;
    the second clamp circuit has a second clamp voltage that is different from the first clamp voltage; and
    the switch circuit is controlled by the output signal of the comparator circuit or an inverted signal thereof.

3. The power supply voltage detection circuit according to claim 2, wherein:
    a number of clamp elements that are included in the first clamp circuit is greater than a number of clamp elements included in the second clamp circuit.

4. The power supply voltage detection circuit according to claim 1, wherein:
    the reference voltage generation circuit includes:
        a fifth transistor and a sixth transistor that have mutually different threshold voltages and constitute a second differential pair; and
        a seventh transistor and an eighth transistor that are respectively connected in series to the fifth transistor and the sixth transistor and constitute a current mirror circuit; and
    a voltage of a connection point of a drain and a gate of the sixth transistor is the reference voltage that is based on a voltage applied to a gate of the fifth transistor.

5. The power supply voltage detection circuit according to claim 4, wherein:
    a ratio of a magnitude of a drain current of the seventh transistor to a magnitude of a drain current of the eighth transistor is 1:2; and
    a ratio of a magnitude of a drain current of the third transistor to a magnitude of a drain current of the fourth transistor is 1:1.

6. The power supply voltage detection circuit according to claim 1, wherein the comparator circuit further includes:
    a ninth transistor that has a gate that is connected to a drain of the second transistor and a drain of the fourth transistor; and
    a tenth transistor that supplies a constant current to a drain of the ninth transistor.

7. A semiconductor apparatus comprising the power supply voltage detection circuit according to claim 1.

8. A semiconductor apparatus comprising the power supply voltage detection circuit according to claim 2.

9. A semiconductor apparatus comprising the power supply voltage detection circuit according to claim 3.

10. A semiconductor apparatus comprising the power supply voltage detection circuit according to claim 4.

11. A semiconductor apparatus comprising the power supply voltage detection circuit according to claim 5.

12. A semiconductor apparatus comprising the power supply voltage detection circuit according to claim 6.

13. An electronic device comprising the power supply voltage detection circuit according to claim 1.

14. An electronic device comprising the power supply voltage detection circuit according to claim 2.

15. An electronic device comprising the power supply voltage detection circuit according to claim 3.

16. An electronic device comprising the power supply voltage detection circuit according to claim 4.

17. An electronic device comprising the power supply voltage detection circuit according to claim 5.

18. An electronic device comprising the power supply voltage detection circuit according to claim 6.

19. A power supply voltage detection circuit for detecting whether a power supply voltage is greater than or equal to a predetermined voltage, the power supply voltage detection circuit comprising:
   a comparator circuit that:
      compares a comparison voltage generated by the power supply voltage to a reference voltage; and
      includes two transistors that constitute a differential pair, wherein gates of the two transistors are connected to a same node.

20. The power supply voltage detection circuit of claim 19, wherein:
   a bias voltage is applied to the same node such that the bias voltage is applied to both gates of the two transistors that constitute the differential pair in the comparator circuit.

21. The power supply voltage detection circuit of claim 19, wherein:
   the comparison voltage is not generated by a voltage divider circuit that divides the power supply voltage.

* * * * *